United States Patent [19]
Masuoka

[11] Patent Number: 6,133,082
[45] Date of Patent: Oct. 17, 2000

[54] METHOD OF FABRICATING CMOS SEMICONDUCTOR DEVICE

[75] Inventor: Sadaaki Masuoka, Tokyo, Japan

[73] Assignee: NEC Corporation, Tokyo, Japan

[21] Appl. No.: 09/382,698

[22] Filed: Aug. 25, 1999

[30] Foreign Application Priority Data

Aug. 28, 1998 [JP] Japan .................................. 10-242848

[51] Int. Cl.$^7$ .............................................. H01L 21/8238
[52] U.S. Cl. ........................ 438/227; 438/199; 438/223; 438/231; 438/217
[58] Field of Search .................................. 438/199, 217, 438/223, 224, 225, 227, 228, 229, 230, 231, 232

[56] References Cited

U.S. PATENT DOCUMENTS

| 5,217,910 | 6/1993 | Shimizu et al. | 438/231 |
| 5,716,861 | 2/1998 | Moslehi | 438/231 |
| 5,770,494 | 6/1998 | Yamamoto | 438/232 |

FOREIGN PATENT DOCUMENTS 63-196070  8/1988  Japan .

OTHER PUBLICATIONS

L. Su et al., "High–Performance 0.08 μm CMOS", Symposium on VLSI Technology Digest of Technical Papers, (1996), pp. 12–13 with Abstract.

A. Ono et al., "Suppression of V$_{th}$ fluctuation by minimizing transient enhanced diffusion for deep sub–quarter micron MOSFET", IEDM Technical Digest, (1996), pp. 755–758 with Abstract.

S. Ohkawa et al., "Thermal Oxidation of Arsenic–Diffused Silicon", Journal of Electrochemical Society, (Dec. 1978), pp. 1997–2002 with Abstract.

*Primary Examiner*—Wael Fahmy
*Assistant Examiner*—Brook Kebede
*Attorney, Agent, or Firm*—Sughrue, Mion, Zinn, Macpeak & Seas, PLLC

[57] ABSTRACT

A method of fabricating a CMOS semiconductor device is provided, which decreases the number of necessary photolithography processes for forming the LDD and pocket structures. A first pair of doped regions of a first conductivity type are formed in a first section of a semiconductor substrate and a second pair of doped regions of the first conductivity type are formed in a second section thereof. Then, a third pair of doped regions of a second conductivity type are formed in the first pair of doped regions and a fourth pair of doped regions of the second conductivity type are formed in the second pair of doped regions. Thereafter, an impurity of the second conductivity type is selectively ion-implanted into the first section while covering the second section with a mask, thereby forming a fifth pair of doped regions of the second conductivity type from the first pair of remaining doped regions. Further, another impurity of the first conductivity type is selectively ion-implanted into the first section while the second section is covered with the mask, thereby forming a sixth pair of doped regions of the first conductivity type from the second pair of doped regions. The channeling effect of an implanted impurity may be utilized, where a pair of doped regions in one of the first and second sections are formed deeper than another pair of doped regions in the other.

16 Claims, 10 Drawing Sheets

METHOD OF FABRICATING CMOS SEMICONDUCTOR DEVICE

BACKGROUND OF THE INVENTION

1. Field of the Invention

The present invention relates to a method of fabricating a semiconductor device and more particularly, to a method of fabricating a Complementary Metal-Oxide-Semiconductor (CMOS) semiconductor device equipped with n- and p-channel MOS Field-Effect Transistors (MOSFETs) each having the Lightly Doped Drain (LDD) and pocket structures, which restrains effectively the short-channel effects.

2. Description of the Prior Art

In miniaturized MOSFETs, it is essential to restrain the so-called "short-channel effects" such as the threshold voltage lowering and the source-drain breakdown voltage lowering with the decreasing gate length. As a measure to restrain the short-channel effects, the well-known LDD structure has been practically adopted, in which a lightly doped extension region is additionally formed at the gate-side edge of each source/drain region of MOSFETs, thereby decreasing the dopant concentration at the gate-side edge of each drain region and making its p-n junction shallower.

An example of the prior-art methods of fabricating a CMOS semiconductor device with the LDD structure is disclosed in the Japanese Non-Examined Patent Publication No. 63-196070 published in 1988. This prior-art method is explained below with reference to FIGS. 1A to 1C.

First, a device structure shown in FIG. 1A is formed, in which a dielectric isolation region 102 is selectively formed on a main surface of a semiconductor substrate 101, thereby defining an nMOS section S101 where an n-channel MOSFET is formed and a pMOS section S102 where a p-channel MOSFET is formed. An n-type well 103 is formed in the pMOS section S102 of the substrate 101. A p-type well 104 is formed in the nMOS section S101 of the substrate 101. A gate oxide layer 105A is formed on the whole surface of the p-type well 104, and a gate electrode 106A is formed on the layer 105A. A gate oxide layer 105B is formed on the whole surface of the n-type well 103, and a gate electrode 106B is formed on the layer 105B.

Subsequently, arsenic ions ($As^+$) 107 as an n-type impurity are implanted into the substrate 101, thereby forming a pair of n-type lightly doped regions 109 at each side of the gate electrode 106B in the n-type well 103 and a pair of n-type lightly doped regions 108 at each side of the gate electrode 106A in the p-type well 104. The pair of n-type lightly doped regions 109 are formed in self-alignment to the gate electrode 106B and the neighboring isolation region 102. The pair of n-type lightly doped regions 108 are formed in self-alignment to the gate electrode 106A and the neighboring isolation region 102. The state at this stage is shown in FIG. 1A.

Next, as shown in FIG. 1B, the nMOS section S101 (i.e., the p-type well 104) is selectively covered with a resist film 110 and then, boron difluoride ions ($BF_2^+$) 111 as a p-type impurity are selectively implanted into the pMOS section (i.e., the n-type well 103) to be overlapped with the pair of n-type lightly doped regions 109. Thus, the conductivity type of the pair of n-type lightly doped regions 109 are inverted, resulting in a pair of p-type lightly doped regions 112 located at each side of the gate electrode 106B in the n-type well 103. The pair of p-type lightly doped regions 112 are formed in self-alignment to the gate electrode 106B and the neighboring isolation region 102. The state at this stage is shown in FIG. 1B.

After the resist film 110 is removed, through popular process steps, a pair of sidewall spacers 113A are formed on the gate oxide layer 105A at each side of the gate electrode 106A and at the same time, a pair of sidewall spacers 113B are formed on the gate oxide layer 105B at each side of the gate electrode 106B, as shown in FIG. 1C.

Further, an n-type impurity is selectively ion-implanted into the p-type well 104 to be overlapped with the pair of n-type lightly doped regions 108, thereby forming a pair of n-type heavily doped regions 114 in the p-type well 104. The pair of n-type heavily doped regions 114 are formed in self-alignment to the sidewall spacers 113A and the neighboring isolation region 102. Similarly, a p-type impurity is selectively ion-implanted into the n-type well 103 to be overlapped with the pair of p-type lightly doped regions 112, thereby forming a pair of p-type heavily doped regions 115 in the n-type well 103. The pair of p-type heavily doped regions 115 are formed in self-alignment to the sidewall spacers 113B and the neighboring isolation region 102. As a result, as shown in FIG. 1C, the pair of n-type lightly doped regions 108 are left only below the gate electrode 106A, forming a pair of n-type extension regions. The pair of p-type lightly doped regions 112 are left only below the gate electrode 106B, forming a pair of p-type extension regions.

Each of the pair of p-type heavily doped regions 115 and a corresponding one of the pair of p-type lightly doped regions 112 (i.e., the p-type extension region) constitute a source/drain region of a p-channel MOSFET M102. Each of the pair of n-type heavily doped regions 114 and a corresponding one of the pair of n-type lightly doped regions 108 (i.e., the n-type extension region) constitute a source/drain region of an n-channel MOSFET M101.

Thus, the CMOS semiconductor device having the n- and p-channel MOSFETs M101 and M102 with the LDD structure is fabricated.

With the prior-art method of fabricating the CMOS-structured semiconductor device shown in FIGS. 1A to 1C, there is an advantage that the pair of n-type lightly doped regions 108 and the pair of p-type lightly doped regions 112 are formed through a single photolithography process for forming the resist film 110. Also, there is another advantage that the short channel effects can be restrained because each source/drain region is provided with the lightly doped extension region 108 or 112 having a shallow p-n junction below the gate electrode 106A or 106B.

However, there is a problem that the above-described LDD structure is unable to restrain the short-channel effects to an acceptable level in further-miniaturized MOSFETs having the gate length of approximately 0.1 μm or less. To solve this problem, an improved method to add a "pocket region" or "halo region" to the LDD structure has been developed. An example of this improved method is disclosed in 1996 Symposium on VLSI Technology Digest of Technical Papers, pp. 12–13, which was written by L. Su et al., entitled "A High-Performance 0.08 μm CMOS", and issued in 1996. This prior-art method is explained below with reference to FIGS. 2A to 2D.

First, a device structure shown in FIG. 2A is formed, in which a dielectric isolation region 202 is selectively formed on a main surface of a semiconductor substrate 201, thereby defining an nMOS section S201 where an n-channel MOSFET is formed and a pMOS section S202 where a p-channel MOSFET is formed. An n-type well 203 and a p-type well 204 are formed in the pMOS and nMOS sections S202 and S201 of the substrate 201, respectively. A gate oxide layer 205A is formed on the whole surface of the p-type well 204, and a gate electrode 206A is formed on the layer 205A. A gate oxide layer 205B is formed on the whole surface of the n-type well 203, and a gate electrode 206B is formed on the layer 205B.

Next, as shown in FIG. 2B, the nMOS section S201 is covered with a resist film 207 and then, arsenic ions (As$^+$) 208 are implanted into the n-type well 203 with a specific tilt angle with respect to the normal of the main surface of the substrate 201. The implantation direction of As$^+$ is shown by inclined arrows in FIG. 2B. Then, boron difluoride ions (BF$_2^+$) 210 are implanted into the same n-type well 203 to be overlapped with the arsenic-implanted regions along the normal of the main surface of the substrate 201 (i.e., with the tilt angle of zero). The implantation direction of BF$_2^+$ is shown by vertical arrows in FIG. 2B.

Thus, as shown in FIG. 2B, a pair of n-type doped regions 209 and a pair of p-type lightly doped regions 211 are formed at each side of the gate electrode 206B in the n-type well 203. The pair of p-type regions 211 are shallower than the pair of n-type regions 209. The peripheries of the p-type regions 211 are surrounded by the n-type regions 209. The state at this stage is shown in FIG. 2B.

After the resist film 207 is removed, similarly, as shown in FIG. 2C, the pMOS section S202 (i.e., the n-type well 203) is covered with a resist film 212 and then, BF$_2$ ions 213 are implanted into the p-type well 204 with a specific tilt angle. The implantation direction of BF$_2^+$ is shown by inclined arrows in FIG. 2C. Then, As ions 215 are implanted into the same p-type well 204 along the normal of the main surface of the substrate 201 (i.e., with the tilt angle of zero). The implantation direction of As$^+$ is shown by vertical arrows in FIG. 2C.

Thus, as shown in FIG. 2C, a pair of p-type doped regions 214 and a pair of n-type lightly doped regions 216 are formed at each side of the gate electrode 206A in the p-type well 204. The pair of n-type regions 216 are shallower than the pair of p-type regions 214. The peripheries of the n-type regions 216 are surrounded by the p-type regions 214. The state at this stage is shown in FIG. 2C.

After the resist film 212 is removed, through popular process steps, a pair of sidewall spacers 217A are formed on the gate oxide layer 205A at each side of the gate electrode 206A and at the same time, a pair of sidewall spacers 217B are formed on the gate oxide layer 205B at each side of the gate electrode 206B, as shown in FIG. 2D.

Following this step of forming the sidewall spacers 217A and 217B, an n-type impurity is ion-implanted into the p-type well 204 to be overlapped with the pairs of p- and n-type doped regions 214 and 216, thereby forming a pair of n-type heavily doped regions 218. The pair of n-type regions 218 are formed in self-alignment to the sidewall spacers 217A and the neighboring isolation region 202. Similarly, a p-type impurity is selectively ion-implanted into the n-type well 203 to be overlapped with the pairs of p- and n-type regions 211 and 209, thereby forming a pair of p-type heavily doped regions 219. The pair of p-type regions 219 are formed in self-alignment to the sidewall spacers 217B and the neighboring isolation region 202.

Each of the pair of p-type heavily doped regions 219, a corresponding one of the pair of p-type lightly doped regions 211, and a corresponding one of the pair of n-type doped regions 209 constitute a source/drain region of a p-channel MOSFET M202. Each of the pair of n-type heavily doped regions 218, a corresponding one of the pair of p-type doped regions 214, and a corresponding one of the pair of n-type lightly doped regions 216 constitute a source/drain region of an n-channel MOSFET M201.

The remaining n-type doped regions 209 and the remaining p-type doped regions 214 constitute the pocket regions. Therefore, each of the n- and p-channel MOSFETs M201 and M202 has both the LDD structure and the pocket structure. The n-type pocket regions 209 have a dopant concentration greater than that of the n-type well 203. The p-type pocket regions 214 have a dopant concentration greater than that of the p-type well 204.

Thus, the CMOS semiconductor device having the n- and p-channel MOSFETs M201 and M202 with the LDD and pocket structures is fabricated.

With the prior-art method of fabricating the CMOS-structured semiconductor device having the LDD and pocket structures shown in FIGS. 2A to 2D, there is an advantage that the short-channel effects can be restrained to an acceptable level for the miniaturized MOSFETs having the gate length of approximately 0.1 μm or less, because the source/drain regions 114 and 115 include not only the LDD structure and shallow p-n junctions but also the pocket regions 209 and 214.

However, there is a problem that two photolithography process steps are required for forming the resist films 207 and 212. In other words, the number of the necessary photolithography process steps are two. From the viewpoint of the fabrication cost and mask overlay error, it is preferred that the number of photolithography steps is as small as possible.

SUMMARY OF THE INVENTION

Accordingly, an object of the present invention to provide a method of fabricating a CMOS semiconductor device that makes it possible to decrease the number of necessary lithography processes for forming source/drain regions of n- and p-channel MOSFETs with the LDD and pocket structures.

Another object of the present invention to provide a method of fabricating a CMOS semiconductor device that makes it possible to form impurity-doped regions used for extension regions and pocket regions of n- and p-channel MOSFETs by a single lithography process.

Still another object of the present invention to provide a method of fabricating a CMOS semiconductor device that restrains the current leakage and the parasitic capacitance existing at the p-n junctions of the source/drain regions.

The above objects together with others not specifically mentioned will become clear to those skilled in the art from the following description.

According to a first aspect of the present invention, a method of fabricating a CMOS semiconductor device having LDD and pocket structures is provided, which is comprised of the following steps (a) to (h).

(a) A semiconductor substrate having a first section of a first conductivity type and a second section of a second conductivity type opposite to the first conductivity type is prepared.

A first gate insulator is formed on a surface of the first section and a first gate electrode is formed on the first gate insulator. A second gate insulator is formed on a surface of the second section and a second gate electrode is formed on the second gate insulator.

(b) A first impurity of the first conductivity type is ion-implanted into the first and second sections, thereby forming a first pair of doped regions of the first conductivity type in the first section and a second pair of doped regions of the first conductivity type in the second section.

The first pair of doped regions are in self-alignment to the first gate electrode. The second pair of doped regions are in self-alignment to the second gate electrode.

(c) A second impurity of the second conductivity type is ion-implanted into the first and second pairs of doped regions, thereby forming a third pair of doped regions of the second conductivity type in the first pair of doped regions and a fourth pair of doped regions of the second conductivity type in the second pair of doped regions.

The third pair of doped regions are shallower than the first pair of doped regions. The fourth pair of doped regions are shallower than the second pair of doped regions.

(d) A third impurity of the second conductivity type is selectively ion-implanted into the first section while the second section is covered with a mask, thereby forming a fifth pair of doped regions of the second conductivity type from the first pair of remaining doped regions of the first conductivity type after the step (c).

(e) A fourth impurity of the first conductivity type is selectively ion-implanted into the first section while the second section is covered with the mask, thereby forming a sixth pair of doped regions of the first conductivity type from the second pair of doped regions of the second conductivity type after the step (c).

(f) A first pair of sidewall spacers are formed at each side of the first gate electrode, and a second pair of sidewall spacers are formed at each side of the second gate electrode.

(g) A fifth impurity of the second conductivity type is selectively ion-implanted into the first section to be overlapped with the first and third pairs of doped regions, thereby forming a seventh pair of doped regions of the second conductivity type.

The seventh pair of doped regions are in self-alignment to the first pair of sidewall spacers.

The third pair of remaining doped regions of the second conductivity type serve as extension regions of the LDD structure for a first MOSFET. The first pair of remaining doped regions of the first conductivity type serve as pocket regions of the pocket structure for the first MOSFET.

(h) A sixth impurity of the first conductivity type is selectively ion-implanted into the second section to be overlapped with the fifth and sixth pairs of doped regions, thereby forming an eighth pair of doped regions of the first conductivity type.

The eighth pair of doped regions are in self-alignment to the second pair of sidewall spacers.

The sixth pair of remaining doped regions of the first conductivity type serve as extension regions of the LDD structure for a second MOSFET. The fifth pair of remaining doped regions of the second conductivity type serve as pocket regions of the pocket structure for the second MOSFET.

With the method according to the first aspect of the present invention, the first pair of doped regions of the first conductivity type are formed in the first section and the second pair of doped regions of the first conductivity type are formed in the second section in the step (b). Then, the third pair of doped regions of the second conductivity type are formed in the first pair of doped regions and the fourth pair of doped regions of the second conductivity type are formed in the second pair of doped regions in the step (c).

Thereafter, in the step (d), the third impurity of the second conductivity type is selectively ion-implanted into the first section while covering the second section with the mask, thereby forming the fifth pair of doped regions of the second conductivity type from the first pair of remaining doped regions of the first conductivity type. This means that the conductivity type of the first pair of remaining doped regions is turned from the first conductivity type to the second conductivity type.

Further, in the step (e), the fourth impurity of the first conductivity type is selectively ion-implanted into the first section while the second section is covered with the mask, thereby forming the sixth pair of doped regions of the first conductivity type from the second pair of doped regions of the second conductivity type. This means that the conductivity type of the second pair of remaining doped regions is turned from the second conductivity type to the first conductivity type.

Accordingly, the impurity-doped regions (i.e., the first, third, fifth, and sixth pairs of doped regions) used for the extension regions and the pocket regions of n- and p-channel MOSFETs (i.e., the first and second MOSFETs) can be formed by a single lithography process. In other words, the number of necessary lithography processes can be decreased by one compared with the previously-explained prior-art method of FIGS. 2A to 2D.

In a preferred embodiment of the method according to the first aspect, the first impurity of the first conductivity type is obliquely ion-implanted into the first and second sections at a first tilt angle in the step (b), and the third impurity of the second conductivity type is obliquely ion-implanted into the first section at a second tilt angle in the step (d). The second tilt angle is approximately equal to the first tilt angle.

In this embodiment, there is an additional advantage that the first pair of remaining doped regions of the first conductivity type are surely converted to the fifth pair of doped regions of the second conductivity type.

It is preferred that the first and fourth impurities of the first conductivity type are one of As and $BF_2$ and the second and third impurities of the second conductivity type are the other. However, it is needless to say that any other impurities than As and $BF_2$ may be used for the invention.

According to a second aspect of the present invention, another method of fabricating a CMOS semiconductor device having LDD and pocket structures is provided, which is comprised of the following steps (a) to (h).

(a) A semiconductor substrate having a first section of a first conductivity type and a second section of a second conductivity type opposite to the first conductivity type is prepared.

A first gate insulator is formed on a surface of the first section and a first gate electrode is formed on the first gate insulator. A second gate insulator is formed on a surface of the second section and a second gate electrode is formed on the second gate insulator.

(b) A first impurity of the first conductivity type is selectively ion-implanted into the first section while the second section is covered with a mask, thereby forming a first pair of doped regions of the first conductivity type in the first section.

The first pair of doped regions are in self-alignment to the first gate electrode.

(c) A second impurity of the second conductivity type is selectively ion-implanted into the first pair of doped region while the second section is covered with the mask, thereby forming a second pair of doped regions of the second conductivity type in the first pair of doped regions.

The second pair of doped regions are shallower than the first pair of doped regions.

(d) A third impurity of the second conductivity type is ion-implanted into the first and second sections, thereby forming a third pair of doped regions of the second conductivity type in the second section while keeping the implanted third impurity in the second pair of doped regions of the second conductivity type in the first section.

The third pair of doped regions are deeper than the second pair of doped regions because an implantation depth of the third impurity into the second section is greater than that into the first section.

(e) A fourth impurity of the first conductivity type is ion-implanted into the first and second sections, thereby forming a fourth pair of doped regions of the first conductivity type in the third pair of doped regions in the second section while keeping the conductivity type of the second pair of doped regions unchanged in the first section.

(f) A first pair of sidewall spacers are formed at each side of the first gate electrode, and a second pair of sidewall spacers are formed at each side of the second gate electrode.

(g) A fifth impurity of the second conductivity type is selectively ion-implanted into the first section to be overlapped with the first and second pairs of doped regions, thereby forming a fifth pair of doped regions of the second conductivity type.

The fifth pair of doped regions are in self-alignment to the first pair of sidewall spacers.

The second pair of remaining doped regions serve as extension regions of the LDD structure for a first MOSFET. The first pair of remaining doped regions serve as pocket regions of the pocket structure for the first MOSFET.

(h) A sixth impurity of the first conductivity type is selectively ion-implanted into the second section to be overlapped with the third and fourth pairs of doped regions, thereby forming a sixth pair of doped regions of the first conductivity type.

The sixth pair of doped regions are in self-alignment to the second pair of sidewall spacers.

The fourth pair of remaining doped regions serve as extension regions of the LDD structure for a second MOSFET. The third pair of remaining doped regions serve as pocket regions of the pocket structure for the second MOSFET.

With the method according to the second aspect of the present invention, while the second section is covered with the mask, the first pair of doped regions of the first conductivity type and the second pair of doped regions of the second conductivity type are successively formed in the first section in the steps (b) and (c). Thereafter, in the step (d), the third impurity of the second conductivity type is ion-implanted into the first and second sections, thereby forming the third pair of doped regions of the second conductivity type in the second section while keeping the implanted third impurity in the second pair of doped regions of the second conductivity type in the first section. The third pair of doped regions are deeper than the second pair of doped regions, because the implantation depth of the third impurity into the second section is greater than that into the first section.

The step (d) can be realized by, for example, utilizing the channeling effect of the implanted third impurity into the semiconductor substrate. In other words, the channeling effect of the implanted third impurity is effectively utilized in the second section to form the third pair of doped regions and at the same time, it is suppressed or prevented in the first section in such a way that the implanted third impurity does not enter the first pair of remaining doped regions.

Accordingly, the impurity-doped regions (i.e., the first to fourth pairs of doped regions) used for the extension regions and the pocket regions of n-and p-channel MOSFETs (i.e., the first and second MOSFETs) can be formed by a single lithography process. In other words, the number of necessary lithography processes can be decreased by one compared with the previously-explained prior-art method of FIGS. 2A to 2D.

Also, unlike the above-explained method according to the first aspect, the processes for turning the conductivity type of the first pair of remaining doped regions (step (d)) and the second pair of remaining doped regions (step (e)) are unnecessary. Therefore, there is no possibility that the first pair of doped regions are formed excessively deep in the first section, which means that the bottom of the first pair of doped regions is sufficiently apart from the bottom of the fifth pair of doped regions in the first section. As a result, the current leakage and the parasitic capacitance existing at the p-n junctions of the source/drain regions can be restrained.

In a preferred embodiment of the method according to the second aspect, the third impurity is implanted into the first and second sections at a tilt angle corresponding to a channeling axis of the substrate in the step (d). The third impurity is implanted into the second section deeply due to a channeling effect. The channel effect of the third impurity is restrained in the first section because the surface of the first section has been amorphized by ion-implantation of the first and second impurities in the steps (b) and (c).

In this preferred embodiment, there is an additional advantage that no additional process step is necessary because the amorphization of the surface of the first section is automatically realized by ion-implantation of the first and second impurities.

In another preferred embodiment of the method according to the second aspect, a total dose of the first and fourth impurities of the first conductivity type implanted in the steps (b) and (e) is less than that of the second and third impurities of the second conductivity type implanted in the steps (c) and (d) by approximately $1 \times 10^{14}$ cm$^{-2}$ or greater. This is necessary for ensuring the function of the LDD structure, which was known experimentally.

In still another preferred embodiment of the method according to the second aspect, the third impurity is implanted into the first and second sections at a tilt angle corresponding to a channeling axis of the substrate in the step (d). The third impurity is implanted into the second section deeply due to a channeling effect. The channel effect of the third impurity is restrained in the first section by a dielectric layer formed on the surface of the first section.

In this preferred embodiment, there is an additional advantage that the amorphized surface of the first section can be recovered to restrain the reverse short-channel effect by adding a heat treatment between the steps (c) and (d).

In a further preferred embodiment of the method according to the second aspect, the third impurity is implanted into the first and second sections at a tilt angle corresponding to a channeling axis of the substrate in the step (d). A step of heat treating the substrate is added between the steps (c) and (d), thereby growing the first gate insulator to a first dielectric layer and the second gate insulator to a second dielectric layer thinner than the first dielectric layer. The first dielectric layer has a thickness restraining a channeling effect of the third impurity. The second dielectric layer has a thickness giving substantially no effect to the channeling effect of the third impurity.

In this preferred embodiment, there is an additional advantage that there is an additional advantage that the reverse short-channel effect can be prevented in the n-channel MOSFET because the amorphized area of the first section can be deleted or activated by a step of heat treating the substrate.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
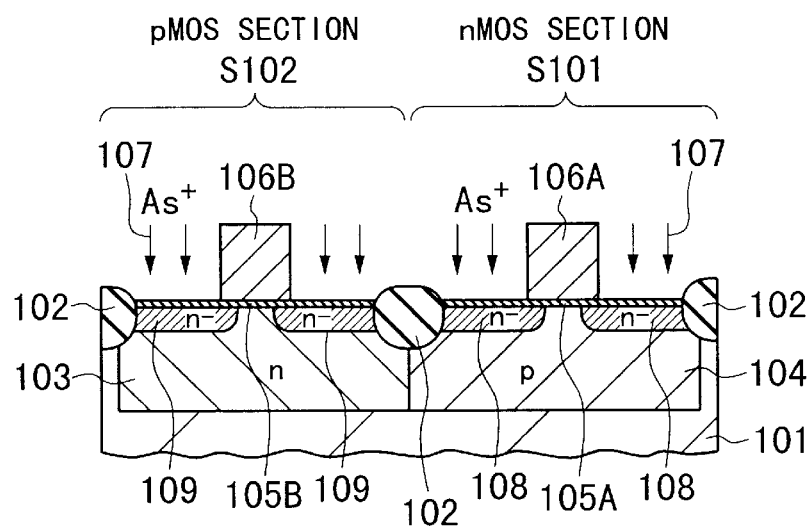
FIGS. 1A to 1C are partial cross-sectional views showing a prior-art method of fabricating a CMOS semiconductor device equipped with n- and p-channel MOSFETs having the LDD structure, respectively.
Figure 1B:
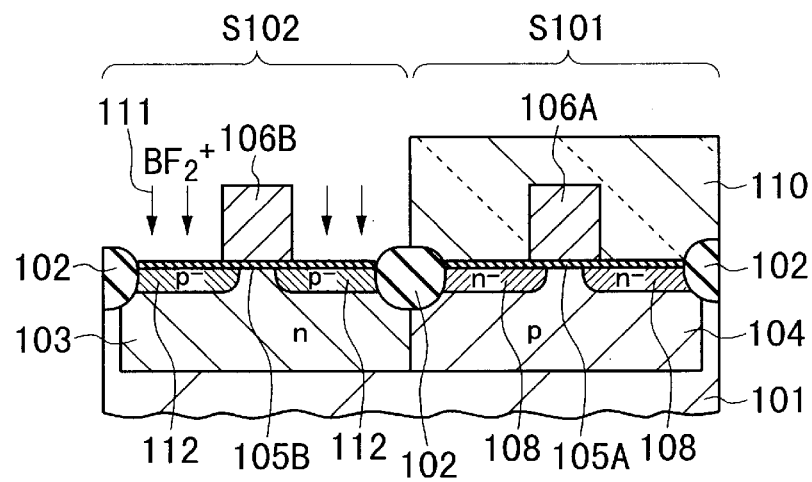
Figure 1C:
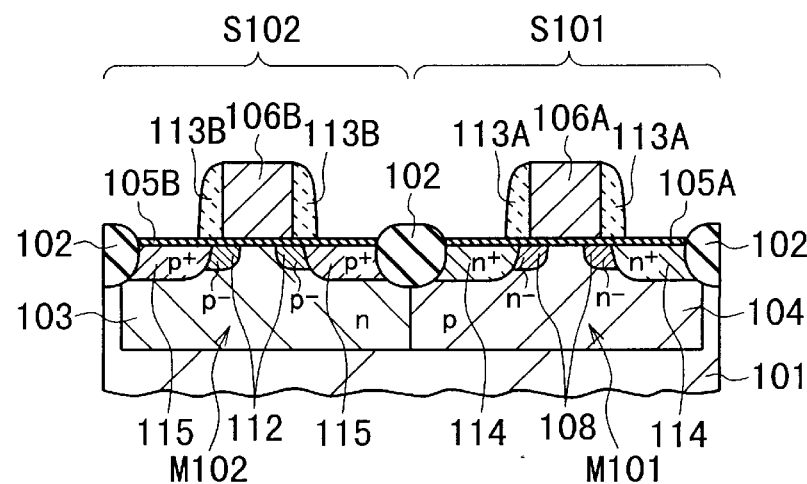
Figure 2A:
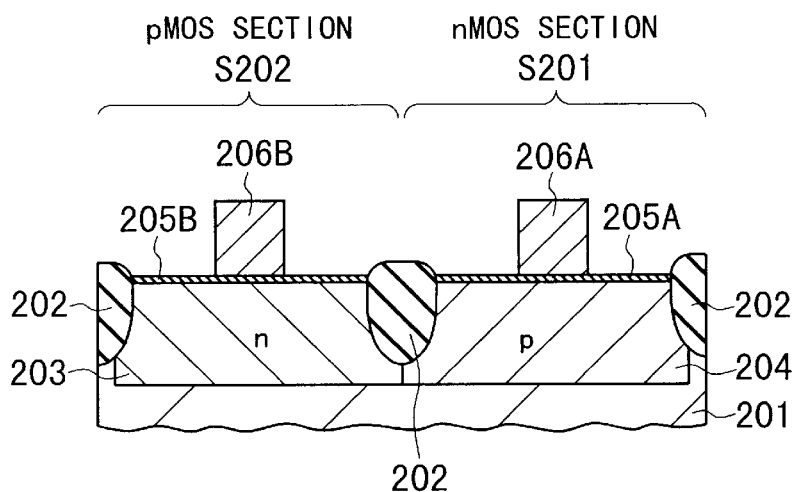
FIGS. 2A to 2D are partial cross-sectional views showing another prior-art method of fabricating a CMOS semiconductor device equipped with n- and p-channel MOSFETs having the LDD and pocket structures, respectively.
Figure 2B:
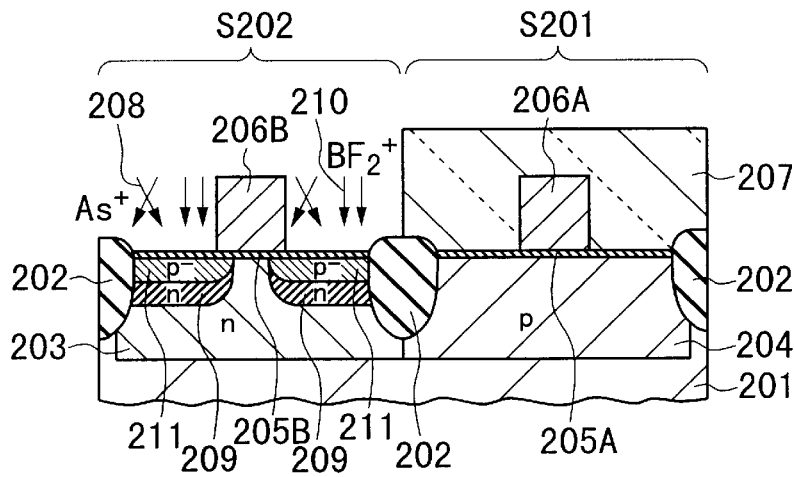
Figure 2C:
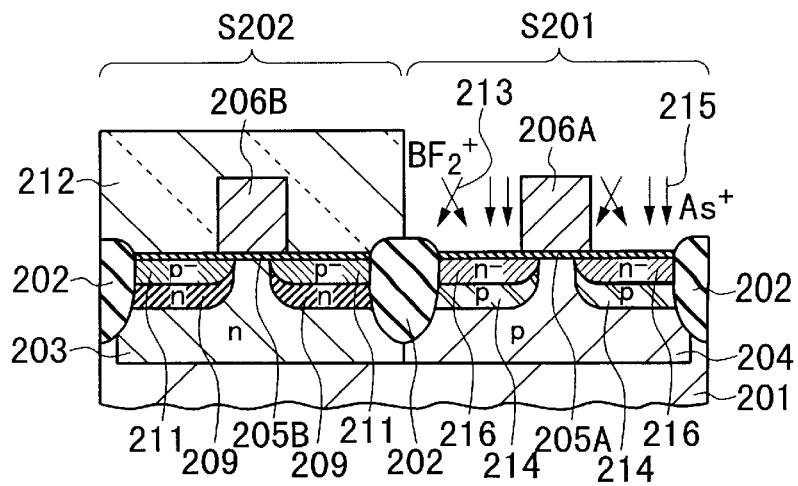
Figure 2D:
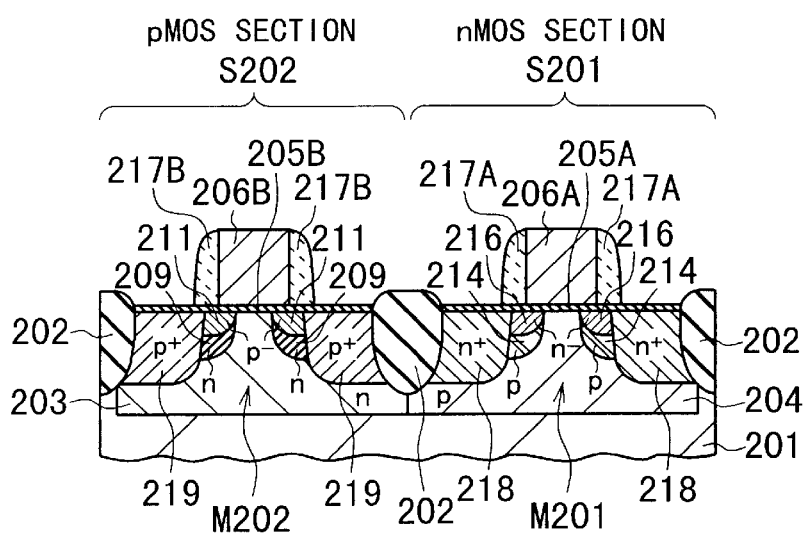

Preferred embodiments of the present invention will be described in detail below while referring to the drawings attached.

FIRST EMBODIMENT

A method of fabricating a CMOS semiconductor device according to a first embodiment of the present invention is explained below with reference to FIGS. 3A to 3F.

Figure 3A:
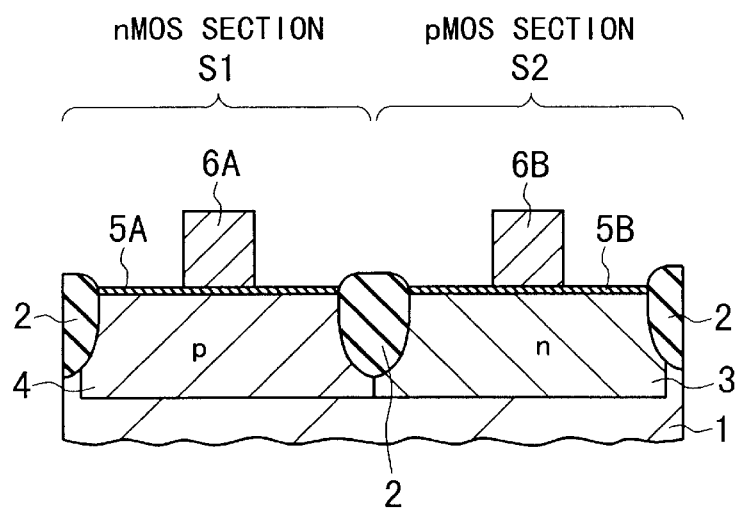
FIGS. 3A to 3F are partial cross-sectional views showing a method of fabricating a CMOS semiconductor device equipped with n- and p-channel MOSFETs having the LDD and pocket structures according to a first embodiment of the present invention, respectively.

First, as shown in FIG. 3A, a dielectric isolation region 2 is selectively formed on a main surface of a p- or n-type, <100>-oriented single-crystal silicon (Si) substrate 1 by known processes, thereby defining an nMOS section S1 where an n-channel MOSFET is formed and a pMOS section S2 where a p-channel MOSFET is formed. These sections S1 and S2 are adjacent to each other.

Then, an n-type well 3 is formed in the pMOS section S2 and a p-type well 4 is formed in the nMOS section S1. For example, these wells 3 and 4 are formed in the following way.

Specifically, the n-type well 3 is formed by a first ion-implantation process of phosphorus ($P^+$) at an acceleration energy of 700 keV with a dose of $1.5 \times 10^{13}$ cm$^{-2}$, and a second ion-implantation process of arsenic ($As^+$) at an acceleration energy of 100 keV with a dose of $6 \times 10^{12}$ cm$^{-2}$. The p-type well 4 is formed by a first ion-implantation process of boron ($B^+$) at an acceleration energy of 300 keV with a dose of $2 \times 10^{13}$ cm$^{-2}$, and a second ion-implantation process of boron ($B^+$) at an acceleration energy of 30 keV with a dose of $6 \times 10^{12}$ cm$^{-2}$.

A gate oxide layer 5A is formed on the whole surface of the p-type well 4, and a gate oxide layer 5B is formed on the whole surface of the n-type well 3 by thermal oxidation of the substrate 1. The gate oxide layers 5A and 5B have a same thickness of approximately 5 nm. A polysilicon layer (not shown) with a thickness of approximately 200 nm is then deposited on the gate oxide layers 5A and 5B over the whole surface of the substrate 1. The polysilicon layer thus deposited is patterned by photolithography and dry etching processes, thereby forming gate electrodes 6A and 6B on the gate oxide layers 5A and 5B, respectively. The state at this stage is shown in FIG. 3A.

Figure 3B:
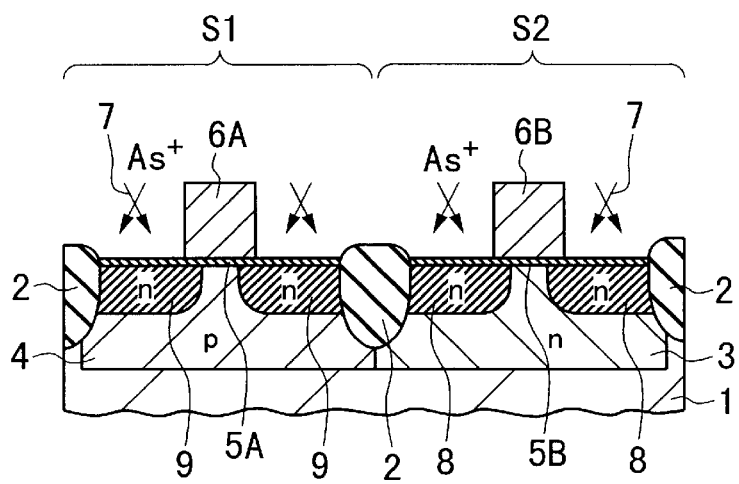

Subsequently, as shown in FIG. 3B, arsenic ions ($As^+$) 7 are implanted into the substrate 1 at an acceleration energy of 70 keV with a dose of $2 \times 10^{13}$ cm$^{-2}$ at a tilt angle of 15° with respect to the normal of the main surface of the substrate 1. The direction of the implantation is shown by inclined arrows in FIG. 3B. Thus, a pair of n-type doped regions 8 are formed in the n-type well 3 and a pair of n-type doped regions 9 are formed in the p-type well 4. The doped regions 8 are formed in self-alignment to the gate electrode 6B and the neighboring isolation region 2. The doped regions 9 are formed in self-alignment to the gate electrode 6A and the neighboring isolation region 2.

Since the implantation process of $As^+$ is carried out at the tilt angle of 15°, the gate-side edges of the n-type doped regions 8 are located at the shifted positions toward the middle of the gate electrode 6B. Similarly, the gate-side edges of the n-type doped regions 9 are located at the shifted positions toward the middle of the gate electrode 6A.

Figure 3C:
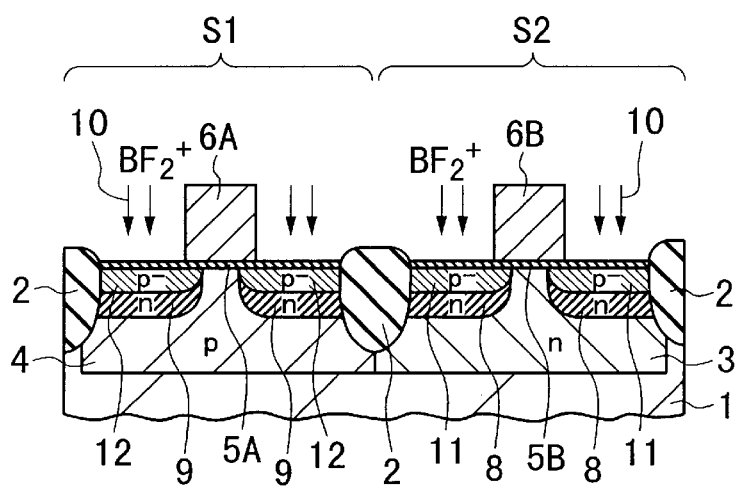

Thereafter, as shown in FIG. 3C, boron difluoride ions ($BF_2^+$) 10 are implanted into the substrate 1 at an acceleration energy of 5 keV with a dose of $1 \times 10^{14}$ cm$^{-2}$ at a tilt angle of 0° (i.e., in parallel) with respect to the normal of the main surface of the substrate 1. In other words, the boron difluoride ions 10 are implanted into the pair of n-type doped regions 8 in the n-type well 3 and the pair of n-type doped regions 9 in the p-type well 4. The implantation direction of $BF_2^+$ is shown by vertical arrows in FIG. 3C.

The dose of $BF_2^+$ ($1 \times 10^{14}$ cm$^{-2}$) is much higher than that of $As^+$ ($2 \times 10^{13}$ cm$^{-2}$), i.e., the former is five times as much as that of the latter. Therefore, the conductivity type of the $BF_2^+$-implanted areas is turned from the n-type to the p-type, resulting in a pair of p-type lightly doped regions 11 in the n-type well 3 and a pair of p-type lightly doped regions 12 in the p-type well 4. Also, since the acceleration energy of $BF_2^+$ (5 keV) is much lower than that of $As^+$ (70 keV), the p-type lightly doped regions 11 and 12 are shallower than the remaining n-type doped regions 8 and 9. The gate-side edges of the p-type lightly doped regions 11 and 12 are located near the gate-side edges of the remaining n-type doped regions 8 and 9, respectively. The state at this stage is shown in FIG. 3C.

Figure 3D:
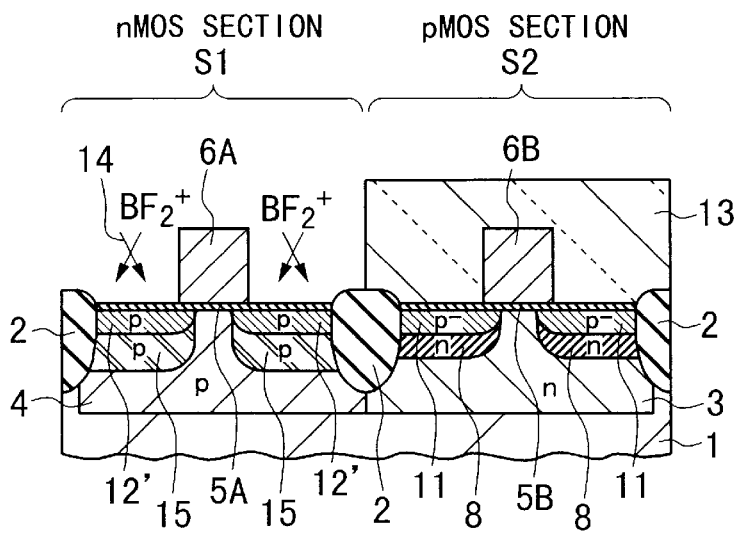

Following this step, as shown in FIG. 3D, the pMOS section S2 (i.e., the n-type well 3) is covered with a photoresist film 13 and then, boron difluoride ions ($BF_2^+$) 14 are implanted into the p-type well 4 at an acceleration energy of 40 keV with a dose of $4 \times 10^{13}$ cm$^{-2}$ at a tilt angle of 15° with respect to the normal of the main surface of the substrate 1. The direction of the implantation is shown by inclined arrows in FIG. 3D. Thus, the pair of p-type lightly doped regions 12 are turned to a pair of p-type doped regions 12' and at the same time, the pair of n-type doped regions 9 are turned to a pair of p-type doped regions 15. The regions 12' and 15 are formed in self-alignment to the gate electrode 6A. The state at this stage is shown in FIG. 3D.

The reason why the pair of n-type doped regions 9 are turned to the pair of p-type doped regions 15 is that the dose of the implanted $BF_2$ ions 14 ($4 \times 10^{13}$ cm$^{-2}$) is twice as much as that of the prior-implanted As ions 7 ($2 \times 10^{13}$ cm$^{-2}$).

Figure 3E:
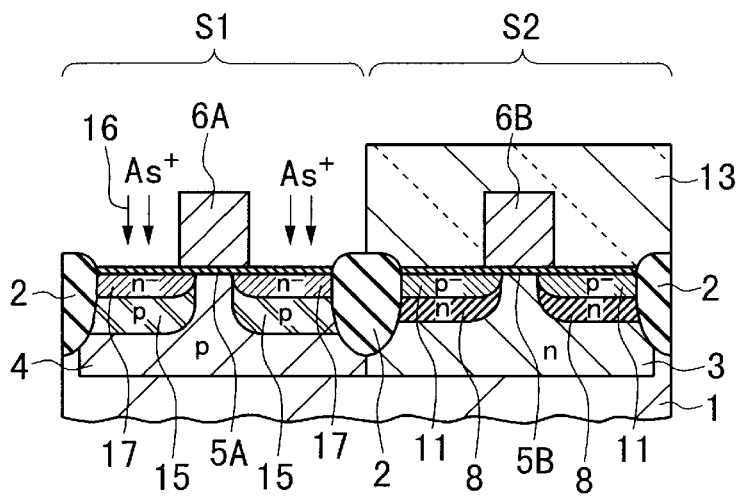

Using the same resist film 13 as a mask, as shown in FIG. 3E, arsenic ions ($As^+$) 16 are implanted into the p-type well 4 at an acceleration energy of 15 keV with a dose of $4 \times 10^{14}$ cm$^{-2}$ at a tilt angle of 0° (i.e., in parallel) with respect to the normal of the main surface of the substrate 1. The direction of the implantation is shown by vertical arrows in FIG. 3E. Thus, the conductivity type of the pair of p-type doped regions 12' is turned to the n-type, resulting in a pair of n-type lightly doped regions 17. The regions 17 are formed in self-alignment to the gate electrode 6A. The state at this stage is shown in FIG. 3E.

The reason why the pair of p-type doped regions 12' are turned to the pair of n-type lightly doped regions 17 is that the total dose of the implanted As ions 7 and 16 ($5 \times 10^{14}$ cm$^{-2}$) is approximately three times as much as that of the prior-implanted BF$_2$ ions 10 and 14 ($1.4 \times 10^{14}$ cm$^{-2}$).

Figure 3F:
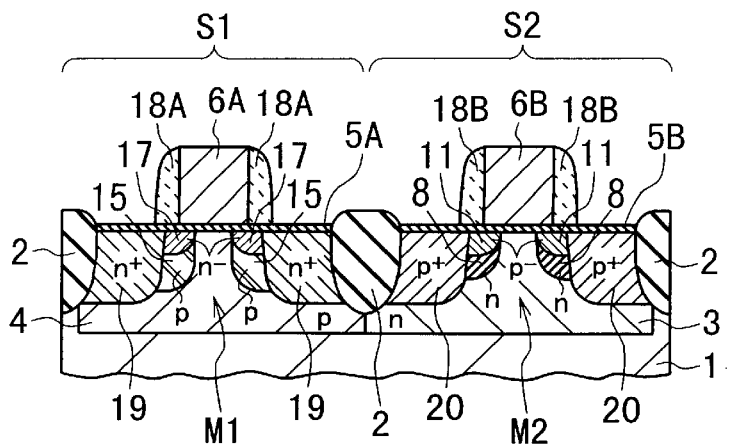

After the resist film 13 is removed, through popular process steps, a pair of sidewall spacers 18A are formed on the gate oxide layer 5A at each side of the gate electrode 6A and at the same time, a pair of sidewall spacers 18B are formed on the gate oxide layer 5B at each side of the gate electrode 6B, as shown in FIG. 3F.

Following this step, through popular process steps, an n-type impurity is selectively ion-implanted into the p-type well 4 to be overlapped with the pair of n-type lightly doped regions 17 and the pair of p-type doped regions 15, thereby forming a pair of n-type heavily doped regions 19. The pair of n-type regions 19 are formed in self-alignment to the sidewall spacers 18A and the neighboring isolation region 2.

Similarly, through popular process steps, a p-type impurity is selectively ion-implanted into the n-type well 3 to be overlapped with the pair of p-type lightly doped regions 11 and the pair of n-type doped regions 8, thereby forming a pair of p-type heavily doped regions 20. The pair of p-type regions 20 are formed in self-alignment to the sidewall spacers 18B and the neighboring isolation region 2.

The state at this stage is shown in FIG. 3F.

Each of the pair of n-type heavily doped regions 19, a corresponding one of the remaining n-type lightly doped regions 17, and a corresponding one of the pair of remaining p-type doped regions 15 constitute a source/drain region of an n-channel MOSFET M1. The n-type heavily doped regions 19 and the n-type lightly doped regions 15 constitute the LDD structure. The p-type doped regions 15 serves as the pocket regions.

Each of the pair of p-type heavily doped regions 20, a corresponding one of the remaining p-type lightly doped regions 11, and a corresponding one of the pair of remaining n-type doped regions 8 constitute a source/drain region of a p-channel MOSFET M2. The p-type heavily doped regions 20 and the p-type lightly doped regions 11 constitute the LDD structure. The n-type doped regions 8 serve as the pocket regions.

Finally, necessary interlayer dielectric layers, wiring layers, and so on (all of which are not shown here) are formed on the device structure shown in FIG. 3F, completing the CMOS semiconductor device.

With the method of fabricating the CMOS semiconductor device having the LDD and pocket structures according to the first embodiment, the As$^+$ implantation process for forming the n-type doped regions 8 and 9 (FIG. 3B) and the BF$_2^+$ implantation process for forming the p-type lightly doped regions 11 and 12 (FIG. 3C) are performed with respect to the whole substrate 1 without using any resist mask. The patterned photoresist film 13 (FIGS. 3D and 3E) is formed by a photolithography process.

Thereafter, using the photoresist film 13 as a mask, the BF$_2^+$ implantation process is performed with respect to the p-type well 4 to invert the conductivity type of the n-type doped regions 9 to the p-type, thereby forming the pair of p-type doped regions 15 (FIG. 3D). Also, using the same photoresist film 13 as a mask, the As$^+$ implantation process is performed with respect to the p-type well 4 to invert the conductivity type of the p-type doped regions 12' to the n-type, thereby forming the pair of n-type lightly doped regions 17 (FIG. 3E).

Accordingly, the source/drain regions with the LDD and pocket structures of the n- and p-channel MOSFETs M1 and M2 can be formed through the single photolithography process for forming the photoresist film 13. This means that the necessary number of photolithography processes is decreased by one compared with the prior-art method shown in FIGS. 2A to 2D.

Also, because not only the LDD structure but also the pocket structure are provided, the short-channel effects can be effectively restrained to an acceptable level for both the n- and p-channel MOSFETs M1 and M2 even if they have the gate length of approximately 0.1 μm or less.

SECOND EMBODIMENT

FIGS. 4A to 4F show a method of fabricating a CMOS semiconductor device according to a second embodiment of the present invention.

Figure 4A:
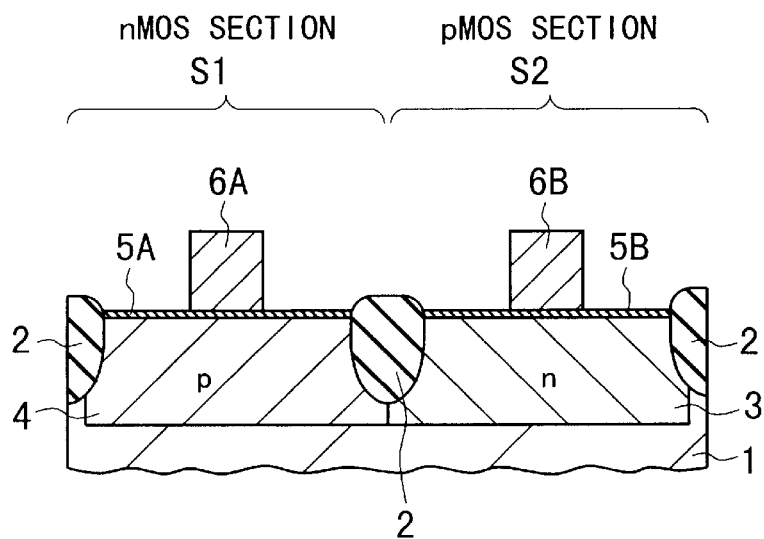
FIGS. 4A to 4F are partial cross-sectional views showing a method of fabricating a CMOS semiconductor device equipped with n- and p-channel MOSFETs having the LDD and pocket structures according to a second embodiment of the present invention, respectively.

First, through the same process steps as those in the first embodiment, the device structure as shown in FIG. 4A is obtained. Specifically, the dielectric isolation region 2 is selectively formed on the main surface of the p- or n-type, <100>-oriented single-crystal Si substrate 1, thereby defining the nMOS and pMOS sections S1 and S2 located adjacent to each other. The n-type well 3 is formed in the pMOS section S2 and the p-type well 4 is formed in the nMOS section S1. The gate oxide layer 5A is formed on the whole surface of the p-type well 4, and the gate oxide layer 5B is formed on the whole surface of the n-type well 3. Gate electrodes 6A and 6B are formed on the gate oxide layers 5A and 5B, respectively.

Figure 4B:
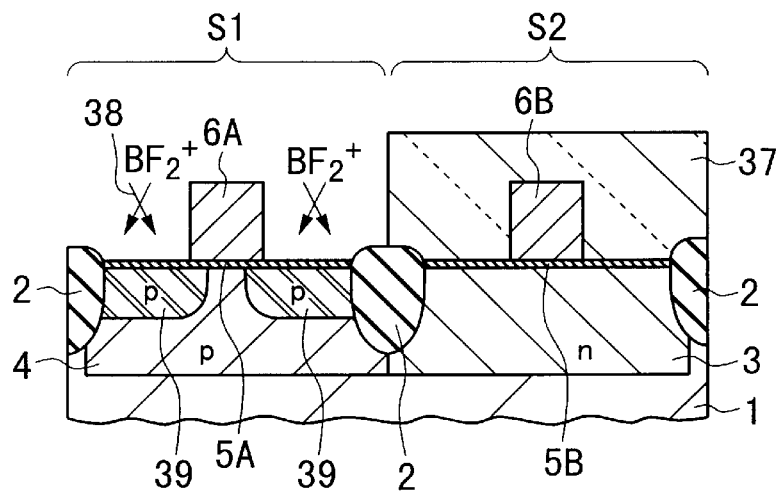

Subsequently, unlike in the first embodiment, as shown in FIG. 4B, the pMOS section S2 (i.e., the n-type well 3) is covered with a photoresist film 37 and then, boron difluoride ions (BF$_2^+$) 38 are implanted into the p-type well 4 at an acceleration energy of 30 keV with a dose of $4 \times 10^{13}$ cm$^{-2}$ at a tilt angle of 15° with respect to the normal of the main surface of the substrate 1. The direction of the implantation is shown by inclined arrows in FIG. 4B. Thus, a pair of p-type doped regions 39 are formed in the p-type well 4 in self-alignment to the gate electrode 6A. The state at this stage is shown in FIG. 4B.

Since the implantation process of BF$_2^+$ is carried out at the tilt angle of 15°, the gate-side edges of the n-type doped regions 39 are located at the shifted positions toward the middle of the gate electrode 6A.

Figure 4C:
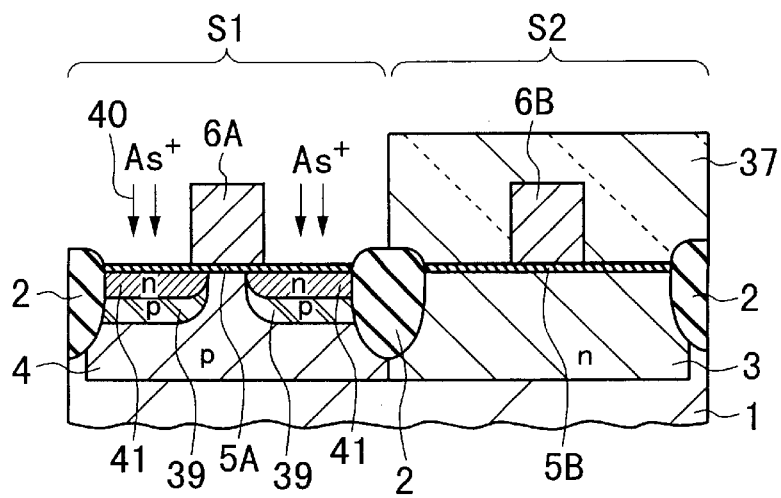

Thereafter, using the same photoresist film 37 as a mask, as shown in FIG. 4C, arsenic ions (As$^+$) 40 are implanted into the p-type well 4 at an acceleration energy of 15 keV with a dose of $4 \times 10^{14}$ cm$^{-2}$ at a tilt angle of 0°. The direction of the implantation is shown by vertical arrows in FIG. 4C. Thus, a pair of n-type doped regions 41 are formed in the p-type well 3 to be overlapped with the pair of p-type doped regions 39. The regions 41 are formed in self-alignment to the gate electrode 6A.

The dose of As$^+$ ($4 \times 10^{14}$ cm$^{-2}$) is much higher than that of BF$_2^+$ ($4 \times 10^{13}$ cm$^{-2}$), i.e., the former is ten times as much as that of the latter. Therefore, the conductivity type of the BF$_2^+$-implanted areas is turned to the n-type, resulting in the pair of n-type doped regions 41. Also, since the acceleration energy of As+ (15 keV) is much lower than that of $BF_2^+$ (30 keV), the n-type doped regions 41 are shallower than the remaining p-type doped regions 39. The gate-side edges of the n-type doped regions 41 are located near the gate-side edges of the p-type doped regions 39. The state at this stage is shown in FIG. 4C.

Figure 4D:
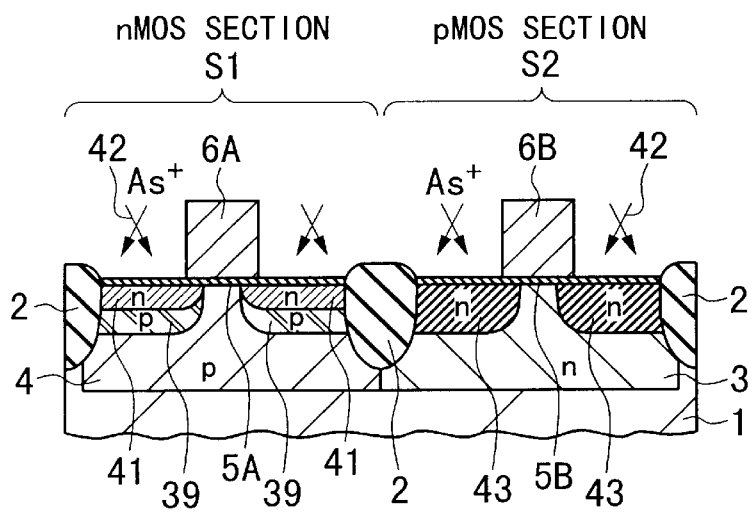

Further, after removing the photoresist film 37, as shown in FIG. 4D, arsenic ions (As+) 42 are obliquely implanted into the substrate 1 at an acceleration energy of 30 keV with a dose of $2 \times 10^{13}$ cm$^{-2}$ at a tilt angle of 25° with respect to the normal of the main surface of the substrate 1. Since the implantation direction is inclined with respect to the <100>-direction of the Si substrate 1 by 25°, it includes a <311>-direction of the substrate 1, i.e., a channeling axis for the implanted ions. Therefore, the implanted As ions 42 reach the substrate 1 deeply due to the channeling effect in the pMOS section S2, thereby forming a pair of n-type doped regions 43 in the n-type well 3, as shown in FIG. 4D.

On the other hand, in the nMOS section S1, the surface of the p-type well 4 has been amorphized due to the prior implantation processes of the $BF_2$ ions 38 and the As ions 40 for forming the p-type doped regions 39 and the n-type doped regions 41 (FIGS. 4B and 4C). Therefore, the channeling effect of the As ions 42 does not occur in the p-type well 4 and accordingly, the obliquely-implanted As ions 42 do not reach the p-type doped regions 39. In other words, the n-type doped regions 41 in the p-type well 4 are shallower than the n-type doped regions 43 in the n-type well 3. Thus, the profile of the of n-type doped regions 41 does not cause any substantial change in the p-type well 4, as shown in FIG. 4D.

The above-described oblique implantation of the As ions 42 may be in the range from 24° to 26° in order to cause substantially the same channeling effect as above.

The oblique implantation of the As ions 42 may be performed at a tilt angle of 45° with respect to the normal of the main surface of the substrate 1. This is due to the fact that the tilt angle of 45° includes the implantation along a <110>-direction of the substrate 1 serving as another channeling axis for the implanted As ions 42. The oblique implantation of the As ions 42 may be in the range from 44° to 46° in order to cause substantially the same channeling effect as above.

Figure 4E:
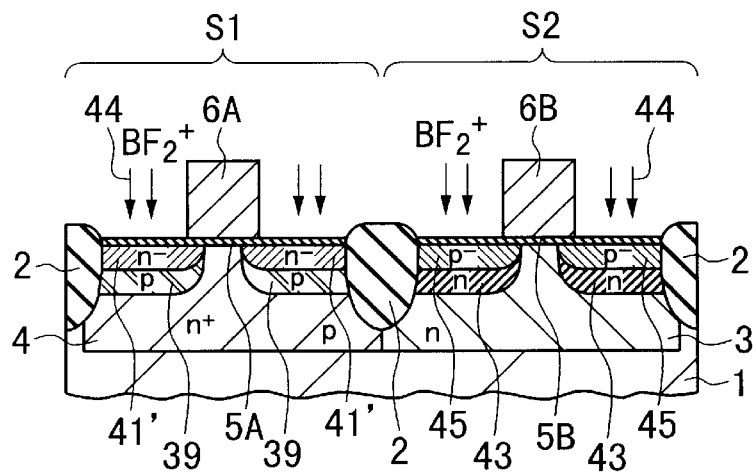

Subsequently, as shown in FIG. 4E, boron difluoride ions ($BF_2^+$) 44 are implanted into the substrate 1 at an acceleration energy of 5 keV with a dose of $1 \times 10^{14}$ cm$^{-2}$ at a tilt angle of 0° (i.e., in parallel). The direction of the implantation is shown by vertical arrows in FIG. 4E. Thus, in the n-type well 3, a pair of p-type lightly doped regions 45 are formed in the pair of n-type doped regions 43 in self-alignment to the gate electrode 6B, as shown in FIG. 4E.

On the other hand, in the p-type well 4, the dose of the $BF_2$ ions 38 and 44 ($1.4 \times 10^{14}$ cm$^{-2}$) is lower than that of the As ions 40 and 42 ($4.2 \times 10^{14}$ cm$^{-2}$), i.e., the former is one third (⅓) as much as that of the latter. Therefore, the conductivity type of the n-type doped regions 41 is not turned to the p-type. However, the dopant concentration of the n-type doped regions 41 is decreased by the implantation of the $BF_2$ ions 44, resulting in a pair of n-type lightly doped regions 41', as shown in FIG. 4E.

Figure 4F:
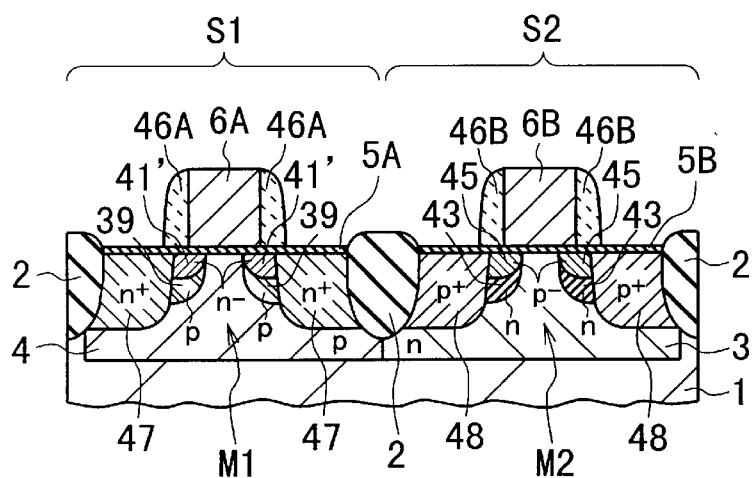

Thereafter, through popular process steps, a pair of sidewall spacers 46A are formed on the gate oxide layer 5A at each side of the gate electrode 6A and at the same time, a pair of sidewall spacers 46B are formed on the gate oxide layer 5B at each side of the gate electrode 6B, as shown in FIG. 4F.

Following this step of forming the sidewall spacers 46A and 46B, an n-type impurity is selectively ion-implanted into the p-type well 4 to be overlapped with the pair of n-type lightly doped regions 41' and the pair of p-type doped regions 39. Thus, a pair of n-type heavily doped regions 47 are formed in the p-type well 4 in self-alignment to the sidewall spacers 46A and the neighboring isolation region 2. Similarly, a p-type impurity is selectively ion-implanted into the n-type well 3 to be overlapped with the pair of p-type lightly doped regions 45 and the pair of n-type doped regions 43. Thus, a pair of p-type heavily doped regions 48 are formed in the n-type well 3 in self-alignment to the sidewall spacers 46B and the neighboring isolation region 2.

Each of the pair of n-type heavily doped regions 47, a corresponding one of the remaining n-type lightly doped regions 41, and a corresponding one of the pair of remaining p-type doped regions 39 constitute a source/drain region of an n-channel MOSFET M1. The n-type heavily doped regions 47 and the n-type lightly doped regions 41 constitute the LDD structure. The p-type doped regions 39 serves as the pocket regions.

Each of the pair of p-type heavily doped regions 48, a corresponding one of the p-type lightly doped regions 45, and a corresponding one of the pair of n-type doped regions 43 constitute a source/drain region of a p-channel MOSFET M2. The p-type heavily doped regions 48 and the p-type lightly doped regions 45 constitute the LDD structure. The n-type doped regions 43 serves as the pocket regions.

Finally, necessary interlayer dielectric layers, wiring layers, and so on (all of which are not shown here) are formed on the structure shown in FIG. 4F, completing the CMOS semiconductor device.

With the method of fabricating the CMOS semiconductor device having the LDD and pocket structures according to the second embodiment, to form the n-type doped regions 43 in the n-type well 3 (FIG. 4D), the As ions 42 are obliquely implanted into the substrate 1 at the tilt angle of 25° (i.e., the <311>-direction of the Si substrate 1) or 45° (i.e., the <110>-direction of the Si substrate 1). Therefore, even if the acceleration energy of the As ions 42 is as low as 30 keV, the implanted As ions 42 are able to enter deeply the n-type well 3 due to the channeling effect. As a result, the depth of the n-type doped regions 43 is sufficiently large.

On the other hand, in the p-type well 4, the surface of the substrate 1 has been amorphized due to the prior implantation of the $BF_2$ and As ions 38 and 40 for forming the p-type doped regions 39 and the n-type doped regions 41 (FIGS. 4B and 4C). Therefore, in the implantation process the As ions 44 (FIG. 4E), the channeling effect of the As ions 44 does not occur and accordingly, the obliquely-implanted As ions 44 do not enter so deeply as that in the n-type well 3. In other words, the As ions 44 do not reach the p-type doped regions 39. Thus, the n-type doped regions 41 is formed shallower than the n-type doped regions 43, as shown in FIG. 4D.

Accordingly, the obliquely-implanted As ions 44 do not deepen the p-n junctions of the n-type doped regions 41. In other words, the profile of the of n-type doped regions 41 does not exhibit any substantial change.

As described above, the source/drain regions with the LDD and pocket structures of the n- and p-channel MOSFETs M1 and M2 can be formed through the single photolithography process for forming the photoresist film 37. This means that the necessary number of photolithography processes is decreased by one compared with the prior-art method shown in FIGS. 2A to 2D. Moreover, the short-channel effects can be effectively restrained to an acceptable level for both the n- and p-channel MOSFETs M1 and M2, because not only the LDD structure but also the pocket structure are provided.

There is an additional advantage that the parasitic capacitances at the p-n junctions of the source/drain regions are restrained to a satisfactory low level. This is because the As ions 42 are deeply implanted into the n-type well 3 due to the channeling effect even if the acceleration energy is set as comparatively low (e.g. 30 keV) to form the n-type doped regions 41 shallow into the p-type well 4.

Unlike this, with the method according to the first embodiment, to ensure that the n-type doped regions 9 are turned to the p-type doped regions 15 in the p-type well 4 (FIG. 3D), the $BF_2$ ions 14 need to be implanted into the substrate 1 more deeply than the As ions 16 for ensuring the $n^-$-type regions 17 (FIG. 3E). This means that the $BF_2$ ions 14 need to be implanted at a high acceleration energy. As the p-type doped regions 15 becomes deeper, the bottom of the regions 15 will approach the bottom of the n-type heavily doped regions 19, which increases the current leakage and the parasitic capacitance at the p-n junctions of the source/drain regions.

THIRD EMBODIMENT

FIGS. 5A to 5G show a method of fabricating a CMOS semiconductor device according to a third embodiment of the present invention.

Figure 5A:
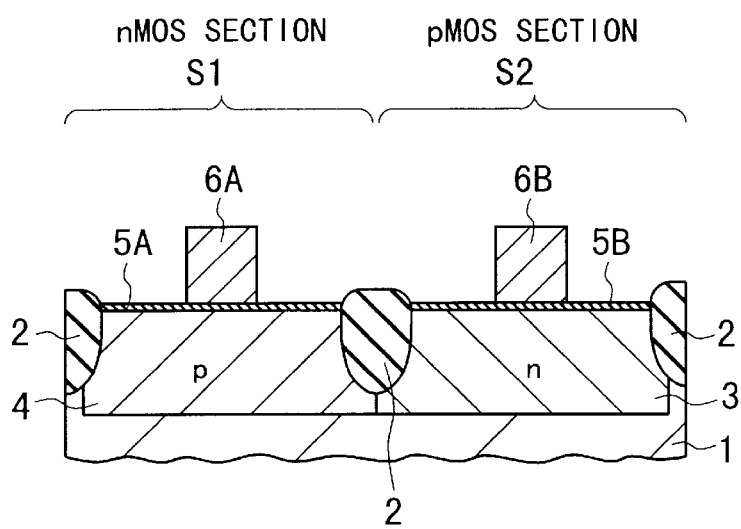
FIGS. 5A to 5G are partial cross-sectional views showing a method of fabricating a CMOS semiconductor device equipped with n- and p-channel MOSFETs having the LDD and pocket structures according to a third embodiment of the present invention, respectively.

First, through the same process steps as those in the first embodiment, the device structure as shown in FIG. 5A is obtained. For the sake of simplification of description, the same reference characters as those in the first embodiment of FIG. 3A are attached in FIG. 5A.

Figure 5B:
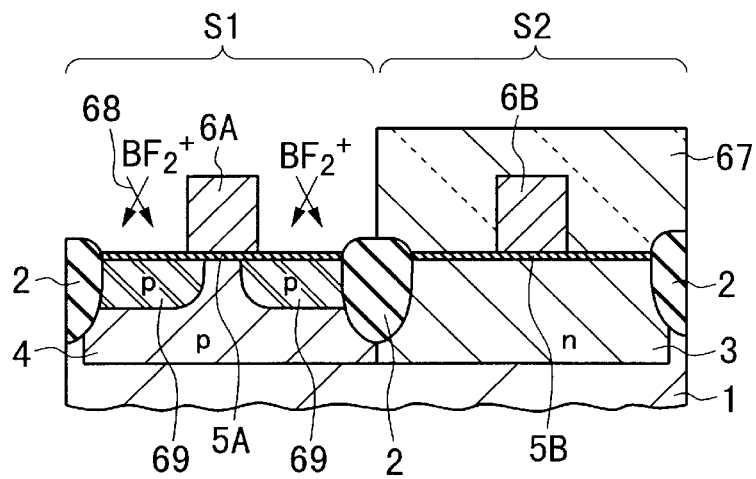

Next, through the same process steps as those in the second embodiment, as shown in FIG. 5B, the pMOS section S2 (i.e., the n-type well 3) is covered with a photoresist film 67 and then, boron difluoride ions ($BF_2^+$) 68 are selectively implanted into the p-type well 4 at an acceleration energy of 30 keV with a dose of $4 \times 10^{13}$ cm$^{-2}$ at a tilt angle of 15° with respect to the normal of the main surface of the substrate 1. The direction of the implantation is shown by inclined arrows in FIG. 5B. Thus, a pair of p-type doped regions 69 are formed in the p-type well 4 in self-alignment to the gate electrode 6A. The state at this stage is shown in FIG. 5B.

Since the implantation process of the $BF_2$ ions 68 is carried out at the tilt angle of 15°, the gate-side edges of the n-type doped regions 69 are located at the shifted positions toward the middle of the gate electrode 6A.

Figure 5C:
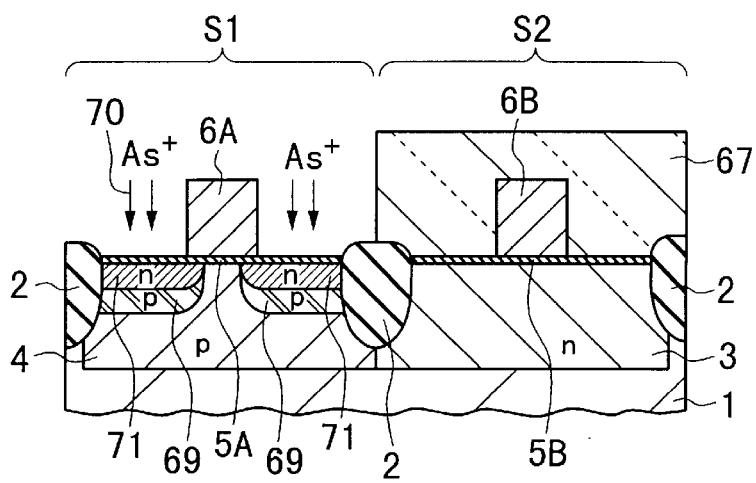

Thereafter, using the same photoresist film 67 as a mask, as shown in FIG. 5C, arsenic ions ($As^+$) 70 are implanted into the p-type well 4 at an acceleration energy of 15 keV with a dose of $4 \times 10^{14}$ cm$^{-2}$ at a tilt angle of 0° with respect to the normal of the main surface of the substrate 1. The direction of the implantation is shown by vertical arrows in FIG. 5C. Thus, a pair of n-type doped regions 71 are formed in the pair of p-type doped regions 69. The regions 71 are formed in self-alignment to the gate electrode 6A.

The dose of $As^+$ ($4 \times 10^{14}$ cm$^{-2}$) is much higher than that of $BF_2^+$ ($4 \times 10^{13}$ cm$^{-2}$), i.e., the former is ten times as much as that of the latter. Therefore, the conductivity type of the $BF_2^+$-implanted areas is turned to the n-type, resulting in the pair of n-type doped regions 71. Also, since the acceleration energy of $As^+$ (15 keV) is much lower than that of $BF_2^+$ (30 keV), the n-type doped regions 71 are shallower than the remaining p-type doped regions 69. The gate-side edges of the n-type doped regions 71 are located near the gate-side edges of the p-type doped regions 69. The state at this stage is shown in FIG. 5C.

The above-described process steps are the same as those in the method according to the second embodiment.

Further, after removing the photoresist film 67, the substrate 1 is subjected to a Rapid Thermal Annealing (RTA) process in a nitrogen ($N_2$) atmosphere at approximately 1000° C. for approximately 10 seconds. This RTA process is performed to restrain the "reverse short-channel effect" in the n-channel MOSFET M1, which is based on the fact reported by A. Ono et al., the 1996 IEDM Technical Digest, pp. 755–758, entitled "Suppression of $V_{th}$ fluctuation by minimizing transient enhanced diffusion for deep sub-quarter micron MOSFET", issued in 1996.

It is sufficient for this purpose that the above RTA process is carried out in an inert atmosphere at 900° to 1100° for 1 to 30 seconds. If the temperature is lower than 900°, the activation effect of the amorphized area by the RTA process tends to be insufficient. If the temperature is higher than 1100°, the dopant atoms existing in the doped regions 69 and 71 tend to diffuse outward during the RTA process, resulting in a disadvantage of the profile change of the regions 69 and 71. If the time is shorter than 1 second, the activation effect of the amorphized area by the RTA process tends to be insufficient. If the time is longer than 30 second, the time for the RTA process is too long.

The "reverse short-channel effect" is a phenomenon that the threshold voltage increases and then, it decreases abruptly, as the channel length becomes shorter.

The above-described RTA process activates the amorphized areas at the surface of the p-type well 4, in other words, the RTA process recrystallized the amorphized area of the p-type well 4. Therefore, unlike the second embodiment, the channeling effect will occur not only in the n-type well 3 but also in the p-type well 4. To make the implantation depth in the p-type well 4 shallower than that in the n-type well 3, the following measure is adopted in the third embodiment.

Figure 5D:
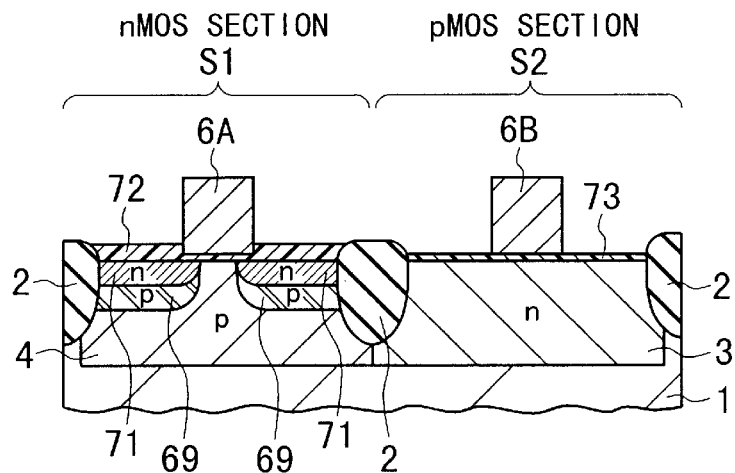

Specifically, a native oxide (not shown) existing on the surface of the substrate 1 is removed and then, the substrate 1 is subjected to a thermal oxidation process under a popular condition. Through this process, the gate oxide layer 5A on the p-type well 4 grows to a thick oxide ($SiO_2$) layer 72 with a thickness of approximately 5.5 nm and at the same time, the gate oxide layer 5B on the n-type well 3 grows to a thin oxide ($SiO_2$) layer 73 with a thickness of approximately 1.3 nm, as shown in FIG. 5D. These oxide layers 72 and 73 having different thickness are realized based on the following fact.

For example, as reported by S. Ohkawa et al. in the Journal of Electrochemical Society, pp. 1997–2002, which was entitled "Thermal Oxidation of Arsenic-Diffused Silicon", and issued in 1978, the oxidation rate of Si becomes higher as the introduced dopant into Si is increased. From the point of view, because of the prior implantation of the $BF_2$ and As ions 68 and 70, the dopant concentration at the surface of the p-type well 4 is much higher than that at the surface of the n-type well 3. Therefore, the surface of the p-type well 4 has an oxidation rate approximately five times as much as that of the surface of the n-type well 3, resulting in the thick oxide layer 72 (approximately 5.5 nm thick) on the p-type well 4 and the thin oxide layer 73 (approximately 1.3 nm thick) on the n-type well 3. These oxide layers 72 and 73 can be obtained with good controllability.

To accomplish the above-described purpose, it is sufficient that the thickness of the thick oxide layer 72 may be approximately 5 nm or greater and the thickness of the thin oxide layer 73 may be approximately 1.5 nm or less.

Figure 5E:
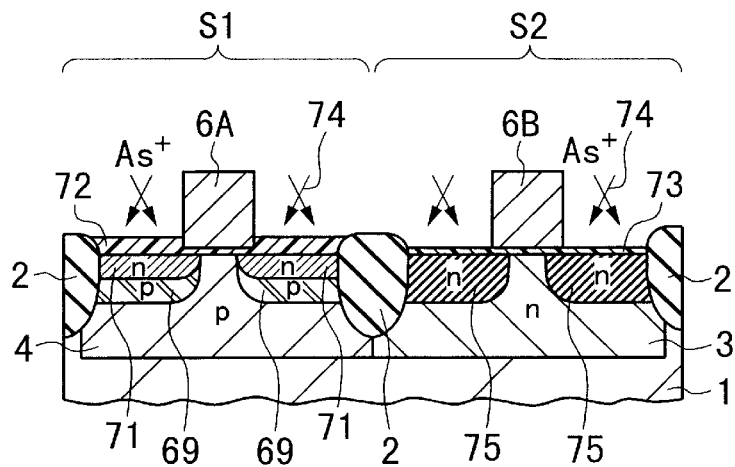

Subsequently, as shown in FIG. 5E, As ions 74 are obliquely implanted into the substrate 1 through the oxide layers 72 and 73 at an acceleration energy of 30 keV with a dose of $2 \times 10^{13}$ cm$^{-2}$ at a tilt angle of 25° with respect to the normal of the main surface of the substrate 1. Since the implantation direction is inclined with respect to the <100>-direction of the substrate 1 by 25°, it includes a <311>-direction of the substrate 1, i.e., a channeling axis for the implanted ions.

In the pMOS section S2, the As ions 74 are implanted through the thin oxide layer 73. Therefore, the implanted As ions 74 reach the substrate 1 deeply due to the channeling effect, thereby forming a pair of deep, n-type doped regions 75 in the n-type well 3, as shown in FIG. 5E.

On the other hand, in the nMOS section S1, the thick oxide layer 72 exists on the surface of the section S1 and therefore, the channeling effect of the As ions 74 does not occur. Accordingly, the obliquely-implanted As ions 74 do not reach the p-type doped regions 69 but kept in the n-type doped regions 71. In other words, the n-type doped regions 71 are shallower than the n-type doped regions 75. Thus, the profile of the n-type doped regions 71 does not exhibit any substantial change, as shown in FIG. 5E.

The above-described oblique implantation of the As ions 74 may be performed at a tilt angle of 45° with respect to the normal of the main surface of the substrate 1, which includes a <110>-direction of the substrate 1 serving as a channeling axis for the implanted ions.

Figure 5F:
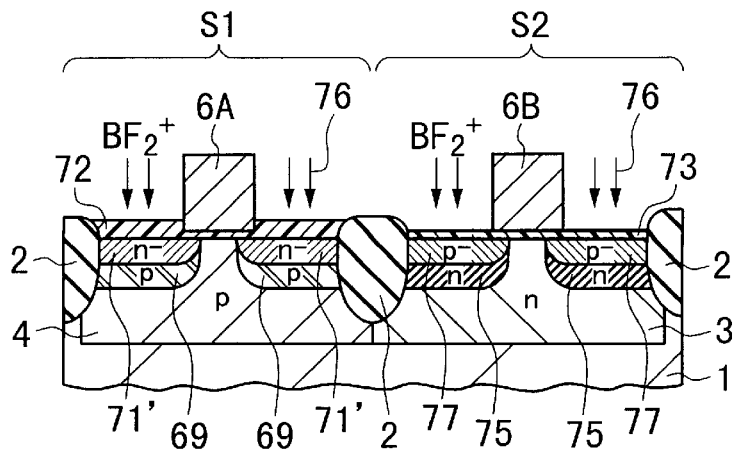

Subsequently, as shown in FIG. 5F, BF$_2$ ions 76 are implanted into the whole substrate 1 at an acceleration energy of 5 keV with a dose of $1 \times 10^{14}$ cm$^{-2}$ at a tilt angle of 0° (i.e., in parallel). The direction of the implantation is shown by vertical arrows in FIG. 5F. Thus, a pair of p-type lightly doped regions 77 are formed in the pair of n-type doped regions 75 in the n-type well 3 in self-alignment to the gate electrode 6B.

On the other hand, in the p-type well 4, since the dose of the BF$_2$ ions 68 and 76 ($1.4 \times 10^{14}$ cm$^{-2}$) is lower than that of the As ions 70 and 74 ($4.2 \times 10^{14}$ cm$^{-2}$), i.e., the former is one third (⅓) as much as that of the latter. Therefore, the conductivity type of the n-type doped regions 71 is not turned to the p-type. However, the concentration of the regions 71 is decreased by the implantation of BF$_2$$^+$, resulting in a pair of n-type lightly doped regions 71', as shown in FIG. 5F.

Figure 5G:
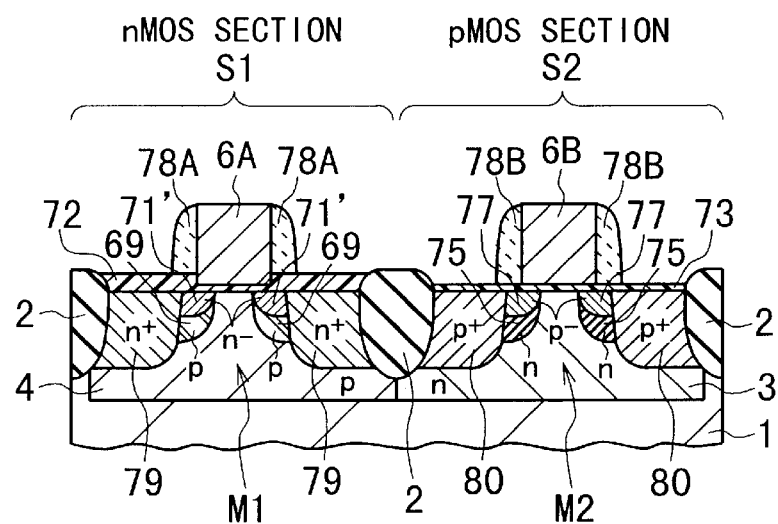

Thereafter, through popular process steps, a pair of sidewall spacers 78A are formed on the thick oxide layer 72 at each side of the gate electrode 6A and at the same time, a pair of sidewall spacers 78B are formed on the thin oxide layer 73 at each side of the gate electrode 6B, as shown in FIG. 5G.

Following this step of forming the sidewall spacers 78A and 78B, an n-type impurity is selectively ion-implanted into the p-type well 4 to be overlapped with the pair of n-type lightly doped regions 71' and the pair of p-type doped regions 69, thereby forming a pair of n-type heavily doped regions 79 in self-alignment to the sidewall spacers 78A and the neighboring isolation region 2. Similarly, a p-type impurity is selectively ion-implanted into the n-type well 3 to be overlapped with the pair of p-type lightly doped regions 77 and the pair of n-type doped regions 75, thereby forming a pair of p-type heavily doped regions 80 in self-alignment to the sidewall spacers 78B and the neighboring isolation region 2.

Each of the pair of n-type heavily doped regions 79, a corresponding one of the remaining n-type lightly doped regions 71, and a corresponding one of the pair of remaining p-type doped regions 69 constitute a source/drain region of an n-channel MOSFET M1. The n-type heavily doped regions 79 and the n-type lightly doped regions 71 constitute the LDD structure. The p-type doped regions 69 serve as the pocket regions.

Each of the pair of p-type heavily doped regions 80, a corresponding one of the p-type lightly doped regions 77, and a corresponding one of the pair of n-type doped regions 75 constitute a source/drain region of a p-channel MOSFET M2. The p-type heavily doped regions 80 and the p-type lightly doped regions 77 constitute the LDD structure. The n-type doped regions 75 serves as the pocket regions.

Finally, necessary interlayer dielectric layers, wiring layers, and so on (all of which are not shown here) are formed on the structure shown in FIG. 5G, completing the CMOS semiconductor device.

With the method of fabricating the CMOS semiconductor device having the LDD and pocket structures according to the third embodiment, instead of the amorphized area of the p-type well 4 in the second embodiment, the thick and thin oxide layers 72 and 73 are used to make the depth of the n-type doped regions 71 and 75 different. Accordingly, because of the same reason as that in the second embodiment, there are the same advantages as those in the second embodiment.

To make the depth of the n-type doped regions 71 and 75 different, any other measure than those shown in the second and third embodiments may be used for the present invention.

In the above-described first to third embodiments, arsenic (As) is used as an n-type dopant and boron difluoride (BF$_2$) is used as a p-type dopant. However, it is needless to say that any other n-type impurity may be used instead of As and any other p-type impurity may be used instead of BF$_2$ in the present invention.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of fabricating a CMOS semiconductor device having LDD and pocket structures, comprising the steps of:
   (a) preparing a semiconductor substrate having a first section of a first conductivity type and a second section of a second conductivity type opposite to said first conductivity type;
   a first gate insulator being formed on a surface of said first section and a first gate electrode being formed on said first gate insulator;
   a second gate insulator being formed on a surface of said second section and a second gate electrode being formed on said second gate insulator;
   (b) ion-implanting a first impurity of said first conductivity type into said first and second sections, thereby forming a first pair of doped regions of said first conductivity type in said first section and a second pair of doped regions of said first conductivity type in said second section;
   said first pair of doped regions being in self-alignment to said first gate electrode, and said second pair of doped regions being in self-alignment to said second gate electrode;

(c) ion-implanting a second impurity of said second conductivity type into said first and second pairs of doped regions, thereby forming a third pair of doped regions of said second conductivity type in said first pair of doped regions and a fourth pair of doped regions of said second conductivity type in said second pair of doped regions;

said third pair of doped regions being shallower than said first pair of doped regions, and said fourth pair of doped regions being shallower than said second pair of doped regions;

(d) selectively ion-implanting a third impurity of said second conductivity type into said first section while said second section is covered with a mask, thereby forming a fifth pair of doped regions of said second conductivity type from said first pair of remaining doped regions of said first conductivity type after the step (c);

(e) selectively ion-implanting a fourth impurity of said first conductivity type into said first section while said second section is covered with said mask, thereby forming a sixth pair of doped regions of said first conductivity type from said second pair of remaining doped regions of said second conductivity type after the step (c);

(f) forming a first pair of sidewall spacers at each side of said first gate electrode and a second pair of sidewall spacers at each side of said second gate electrode;

(g) selectively ion-implanting a fifth impurity of said second conductivity type into said first section to be overlapped with said first and third pairs of doped regions, thereby forming a seventh pair of doped regions of said second conductivity type;

said seventh pair of doped regions being in self-alignment to said first pair of sidewall spacers;

said third pair of remaining doped regions of said second conductivity type serving as extension regions of the LDD structure for a first MOSFET;

said first pair of remaining doped regions of said first conductivity type serving as pocket regions of the pocket structure for said first MOSFET; and (h) selectively ion-implanting a sixth impurity of said first conductivity type into said second section to be overlapped with said fifth and sixth pairs of doped regions, thereby forming an eighth pair of doped regions of said first conductivity type;

said eighth pair of doped regions being in self-alignment to said second pair of sidewall spacers;

said sixth pair of remaining doped regions of said first conductivity type serving as extension regions of the LDD structure for a second MOSFET;

said fifth pair of remaining doped regions of said second conductivity type serving as pocket regions of the pocket structure for said second MOSFET.

2. The method as claimed in claim 1, wherein said first impurity of said first conductivity type is obliquely ion-implanted into said first and second sections at a first tilt angle in the step (b), and said third impurity of said second conductivity type is obliquely ion-implanted into said first section at a second tilt angle in the step (d);

and wherein said second tilt angle is approximately equal to said first tilt angle.

3. The method as claimed in claim 2, wherein said first and second tilt angles are determined not to accord with a channeling axis of said substrate.

4. The method as claimed in claim 2, wherein said first and fourth impurities of said first conductivity type are one of As and $BF_2$ and said second and third impurities of said second conductivity type are the other.

5. A method of fabricating a semiconductor device having LDD and pocket structures, comprising the steps of:

(a) preparing a semiconductor substrate having a first section of a first conductivity type and a second section of a second conductivity type opposite to said first conductivity type;

a first gate insulator being formed on a surface of said first section and a first gate electrode being formed on said first gate insulator;

a second gate insulator being formed on a surface of said second section and a second gate electrode being formed on said second gate insulator;

(b) selectively ion-implanting a first impurity of said first conductivity type into said first section while said second section is covered with a mask, thereby forming a first pair of doped regions of said first conductivity type in said first section;

said first pair of doped regions being in self-alignment to said first gate electrode;

(c) selectively ion-implanting a second impurity of said second conductivity type into said first pair of doped region while said second section is covered with said mask, thereby forming a second pair of doped regions of said second conductivity type in said first pair of doped regions;

said second pair of doped regions being shallower than said first pair of doped regions;

(d) ion-implanting a third impurity of said second conductivity type into said first and second sections, thereby forming a third pair of doped regions of said second conductivity type in said second section while keeping said implanted third impurity in said second pair of doped regions of said second conductivity type in said first section;

said third pair of doped regions being deeper than said second pair of doped regions because an implantation depth of said third impurity into said second section is greater than that into said first section;

(e) ion-implanting a fourth impurity of said first conductivity type into said first and second sections, thereby forming a fourth pair of doped regions of said first conductivity type in said third pair of doped regions in said second section while keeping said second conductivity type of said second pair of doped regions unchanged in said first section;

(f) forming a first pair of sidewall spacers at each side of said first gate electrode and a second pair of sidewall spacers at each side of said second gate electrode;

(g) selectively ion-implanting a fifth impurity of said second conductivity type into said first section to be overlapped with said first and second pairs of doped regions, thereby forming a fifth pair of doped regions of said second conductivity type;

said fifth pair of doped regions being in self-alignment to said first pair of sidewall spacers;

said second pair of remaining doped regions serving as extension regions of the LDD structure for said first MOSFET;

said first pair of remaining doped regions serving as pocket regions of the pocket structure for said first MOSFET; and (h) selectively ion-implanting a sixth impurity of said first conductivity type into said second section to be overlapped with said third and fourth pairs of doped regions, thereby forming a sixth pair of doped regions of said first conductivity type;

said sixth pair of doped regions being in self-alignment to said second pair of sidewall spacers;

said fourth pair of remaining doped regions serving as extension regions of the LDD structure for said second MOSFET;

said third pair of remaining doped regions serving as pocket regions of the pocket structure for said second MOSFET.

6. The method as claimed in claim 5, wherein said third impurity is implanted into said first and second sections at a tilt angle corresponding to a channeling axis of said substrate in the step (d), said third impurity being implanted into said second section deeply due to a channeling effect;

and wherein said channel effect of said third impurity is restrained in said first section because said surface of said first section has been amorphized by ion-implantation of said first and second impurities in the steps (b) and (c).

7. The method as claimed in claim 5, wherein a total dose of said first and fourth impurities of said first conductivity type implanted in the steps (b) and (e) is less than that of said second and third impurities of said second conductivity type implanted in the steps (c) and (d) by approximately $1 \times 10^{14}$ cm$^{-2}$ or greater.

8. The method as claimed in claim 5, wherein said third impurity is implanted into said first and second sections at a tilt angle corresponding to a channeling axis of said substrate in the step (d), said third impurity being implanted into said second section deeply due to a channeling effect;

and wherein the channel effect of said third impurity is restrained in said first section by a dielectric layer formed on said surface of said first section.

9. The method as claimed in claim 8, further comprising a step of heat-treating said substrate between the steps (c) and (d);

wherein said amorphized surface of said first section is recovered to restrain a reverse short-channel effect.

10. The method as claimed in claim 5, wherein said third impurity is implanted into said first and second sections at a tilt angle corresponding to a channeling axis of said substrate in the step (d);

further comprising a step of heat treating said substrate between the steps (c) and (d), thereby growing said first gate insulator to a first dielectric layer and said second gate insulator to a second dielectric layer thinner than said first dielectric layer;

wherein said first dielectric layer has a thickness restraining a channeling effect of said third impurity, and said second dielectric layer has a thickness giving substantially no effect to the channeling effect of said third impurity.

11. The method as claimed in claim 10, wherein said first dielectric layer has a thickness of approximately 5 nm or less and said second dielectric layer has a thickness of approximately 1.5 nm or less.

12. The method as claimed in claim 10, further comprising a step of heat-treating said substrate between the steps (c) and (d) to recover said amorphized surface of said first section, thereby restraining a reverse short-channel effect.

13. The method as claimed in claim 5, wherein said first impurity of said first conductivity type is obliquely ion-implanted into said first section at a first tilt angle in the step (b), and said third impurity of said second conductivity type is obliquely ion-implanted into said first section at a second tilt angle in the step (d);

and wherein said second tilt angle is approximately equal to said first tilt angle.

14. The method as claimed in claim 13, wherein said first and second tilt angles are determined not to accord with a channeling axis of said substrate.

15. The method as claimed in claim 5, wherein said first and fourth impurities of said first conductivity type are one of As and BF$_2$ and said second and third impurities of said second conductivity type are the other.

16. The method as claimed in claim 5, wherein said substrate is a <100>-oriented single-crystal silicon;

and wherein said first impurity of said first conductivity type is obliquely ion-implanted into said first section at a first tilt angle in the step (b), and said third impurity of said second conductivity type is obliquely ion-implanted into said first section at a second tilt angle in the step (d), said second tilt angle being approximately equal to said first tilt angle;

wherein said first and second tilt angles are in a range from 24° to 26° or a range from 44° to 46° with respect to a normal of said substrate.

* * * * *